US008138665B2

(12) United States Patent
Holland et al.

(10) Patent No.: US 8,138,665 B2
(45) Date of Patent: Mar. 20, 2012

(54) LIQUID METAL WETTING OF MICRO-FABRICATED CHARGE-EMISSION STRUCTURES

(75) Inventors: Christopher E. Holland, Redwood City, CA (US); Paul R. Schwoebel, Basque Forma, NM (US); Charles A. Spindt, Menlo Park, CA (US); Eric M. Pearson, Menlo Park, CA (US); Victor M. Aguero, Menlo Park, CA (US)

(73) Assignee: SRI International, Menlo Park, CA (US)

( * ) Notice: Subject to any disclaimer, the term of this patent is extended or adjusted under 35 U.S.C. 154(b) by 353 days.

(21) Appl. No.: 12/306,264

(22) PCT Filed: Jul. 9, 2007

(86) PCT No.: PCT/US2007/073071

§ 371 (c)(1),
(2), (4) Date: Dec. 23, 2008

(87) PCT Pub. No.: WO2008/006110

PCT Pub. Date: Jan. 10, 2008

(65) Prior Publication Data

US 2009/0278434 A1 Nov. 12, 2009

Related U.S. Application Data

(60) Provisional application No. 60/806,756, filed on Jul. 7, 2006.

(51) Int. Cl.
*H01J 1/62* (2006.01)
*H01J 63/04* (2006.01)

(52) U.S. Cl. ........... 313/495; 313/336; 313/351; 445/51

(58) Field of Classification Search .......... 313/495–497, 313/336, 351, 346 R; 445/46, 49, 50, 51
See application file for complete search history.

(56) References Cited

U.S. PATENT DOCUMENTS

| | | | | |
|---|---|---|---|---|
| 5,719,406 | A | 2/1998 | Cisneros et al. | |
| 6,333,598 | B1 | 12/2001 | Hsu et al. | |
| 6,879,162 | B2 | 4/2005 | Aguero et al. | |
| 2003/0146757 | A1 * | 8/2003 | Aguero et al. | 324/453 |
| 2005/0046358 | A1 | 3/2005 | Hilbers et al. | |
| 2005/0279934 | A1 * | 12/2005 | Stewart et al. | 250/310 |
| 2006/0033783 | A1 * | 2/2006 | Bruinsma et al. | 347/65 |

OTHER PUBLICATIONS

International Search Report for international Application No. PCT/US2007/073071 mailed Aug. 11, 2008; 2 pages.

* cited by examiner

*Primary Examiner* — Joseph L Williams
*Assistant Examiner* — Kevin Quarterman
(74) *Attorney, Agent, or Firm* — Guerin & Rodriguez LLP; Michael A. Rodriguez

(57) ABSTRACT

Described is a micro-fabricated charged particle emission device including a substrate and a plurality of charged particle emission sites formed in the substrate. A path extends between each emission site and a source of liquid metal. Each path is coated with a wetting layer of non-oxidizing metal for wetting the liquid metal. Exemplary non-oxidizing metals that may be used to provide the wetting layer include gold and platinum. The wetting layer is sufficiently thin such that some liquid metal is able to flow to each emission site despite any chemical interaction between the liquid metal and the non-oxidizing metal of the wetting layer.

42 Claims, 9 Drawing Sheets

*FIG. 4*
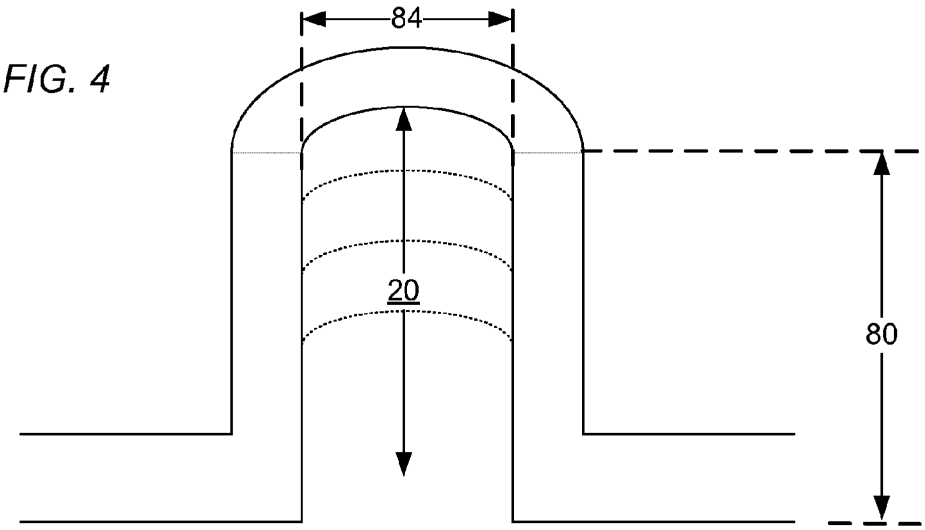
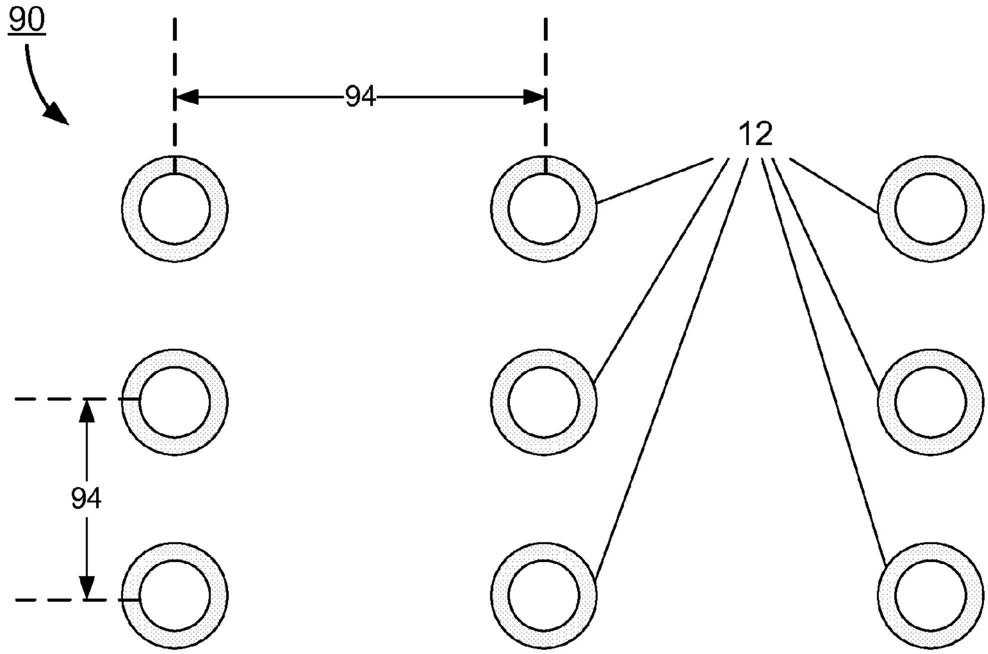
*FIG. 5*

LIQUID METAL WETTING OF MICRO-FABRICATED CHARGE-EMISSION STRUCTURES

RELATED APPLICATION

This utility application claims the benefit of U.S. Provisional Patent Application No. 60/806,756, filed on Jul. 7, 2006, the entirety of which is incorporated by reference herein.

FIELD OF THE INVENTION

The present invention relates generally to micro-fabricated charged particle emission structures. More specifically, the invention relates to liquid metal wetting of the microscopic channels or surfaces of such charged particle emission devices to enable the liquid metal to flow to the emission site.

BACKGROUND

Research communities and microelectronics industries have known about micro-fabricated charged particle emission devices for some time. While there are many types of charged particle emission devices, each type has at least one emitter from which the charged particle emission device can emit electrons or ions, depending upon its type. Some charged particle emission devices use liquid metal as a charged particle source. The liquid metal flows through a channel in the emitter to the emission site, such as the open end of a capillary or an exposed needle-like projection. An applied voltage in excess of a threshold relative to the emission site induces liquid metal at the site to ionize and the emitter to emit charged particles. A further increase in voltage induces a corresponding increase in the emitted charged particles, whereas when the voltage falls below a corresponding threshold, the emitter ceases to emit charged particles.

Because of their microscopic scale of geometries, micro-fabricated charged particle emission devices require relatively low power to emit charged particles efficiently. For instance, the operating voltage for inducing charged particle emission from an emitter tip of a gated charged particle emission device can range between 50 and 100 volts for an electron source and between 500 and 1000 volts for a liquid metal ion source. Consequently, micro-fabricated charged particle emission devices have found use in a variety of applications, such as ion thrusters, micro-fluidic dispensers, and satellite charge controllers.

The microscopic scale of geometries, however, also poses a problem for those charged particle emission devices using liquid metal as a charged particle source: if the liquid metal does not wet the surfaces of the emitter channels properly, it cannot overcome the forces that resist its flow into and through such channels or surfaces. As a result, the liquid metal is unable to readily and reliably flow sufficiently near the emission site in order to be ionized, and the emitter cannot then operate effectively as a charged particle emitter.

Some techniques attempt to improve wetting and the flow of the liquid metal by heating the charged particle emission device. Such heating, however, can cause material to evaporate and coat the emitting structures. For arrays of densely packed emitters and their microscopic geometries, the unwanted coating can have deleterious consequences, such as electrical leakage and shorting. Moreover, some materials used to construct the arrays are unable to withstand the high temperatures sometimes used to improve wetting. There is, therefore, a need for a method and materials to assist in wetting the microscopic channels or along the surfaces of the emitters without the aforementioned disadvantages.

SUMMARY

In one aspect, the invention features a micro-fabricated charged particle emission device comprising a substrate, an array of charged particle emission sites formed in the substrate, and a path between each charged particle emission site and a source of liquid metal. Each path has a surface coated with a wetting layer of a non-oxidizing metal. The wetting layer is sufficiently thin such that some liquid metal is able to flow from the liquid metal source to each emission site despite any chemical interaction between the liquid metal and the non-oxidizing metal of the wetting layer.

In another aspect, the invention features a method of constructing a charged particle emission device. The method comprises fabricating an array of charged particle emission sites in a substrate, with a path between each charged particle emission site and a source of liquid metal. A wetting layer of non-oxidizing metal is applied to a surface of each path for wetting the liquid metal. The wetting layer is sufficiently thin such that some liquid metal is able to flow from the source of liquid metal to each emission site despite any chemical interaction between the non-oxidizing metal of the wetting layer and the liquid metal.

In still another aspect, the invention features a system comprising a micro-fabricated charged particle emission device. The device includes a substrate, a plurality of charged particle emission sites formed in the substrate and a path extending between each emission site and a source of liquid metal. Each path is coated with a wetting layer of non-oxidizing metal for wetting the liquid metal. The wetting layer is sufficiently thin such that some liquid metal is able to flow to each emission site despite any chemical interaction between the liquid metal and the non-oxidizing metal of the wetting layer.

BRIEF DESCRIPTION OF THE DRAWINGS

The above and further advantages of this invention may be better understood by referring to the following description in conjunction with the accompanying drawings, in which like numerals indicate like structural elements and features in the various figures. The drawings are not meant to limit the scope of the invention. For clarity, not every element may be labeled in every figure. The drawings are not necessarily to scale, emphasis instead being placed upon illustrating the principles of the invention.

FIG. 4 is a cross-section view of the emitter for illustrating exemplary dimensions for an emitter micro-channel.

FIG. 5 is diagrammatic illustration of an embodiment of an array of non-gated emitters.

DETAILED DESCRIPTION

In brief overview, micro-fabricated charged particle emission structures embodying the present invention have paths with coated surfaces that reliably and readily wet liquid metals used as a charge source. Examples of micro-fabricated charged particle emission structures that can advantageously use the liquid metal wetting processes of the present invention include, but are not limited to, micro-needles (e.g., tungsten), micro-nozzles, and micro-capillaries. For liquid metal to flow adequately, the micro-fabricated charged particle emission structures require wetting of the surfaces (e.g., within the lumen or micro-channel or on a surface of the micro-fabricated structure). A shallow contact angle between the liquid metal and the surface is a primary property required for proper wetting. The present invention achieves proper liquid metal wetting and filling by coating the surfaces of the paths with a non-oxidizing metal, e.g., gold and platinum. Mild heating of the emission structure in a vacuum enables the liquid metal to be released from its oxide shell and initiates the flow of liquid metal over a coated surface. This behavior allows constrained flow channels to be patterned directly onto any surface of an emission structure. In addition, the non-oxidizing metal coating enable the liquid metal wetting to occur at temperatures hundreds of degrees lower than conventional processes. The lower temperature wetting enables the use of temperature-sensitive micro-fabrication materials, such as silicon oxy-nitrides.

Figure 1:
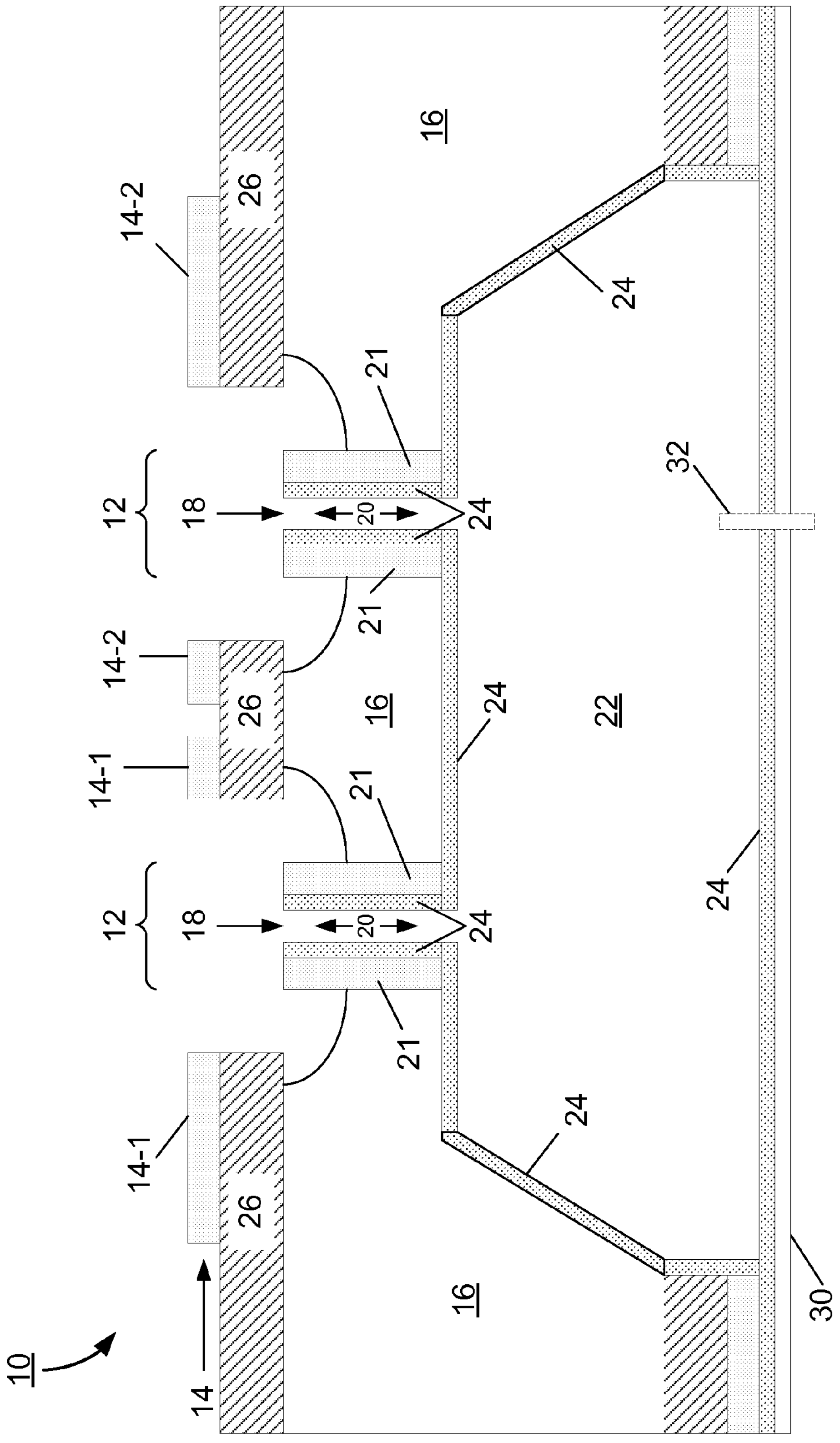
FIG. 1 is a diagram of an embodiment of a micro-fabricated charged particle emission structure, here, a gated charged particle emission device.

FIG. 1 shows an embodiment of a micro-fabricated charged particle emission structure 10 constructed in accordance with the present invention. The particular micro-fabricated charged particle emission structure 10 shown is a gated charged particle emission device having an emitter 12 that emits charged particles (e.g., positive ions, negative ions, or electrons) when subjected to a high electric field. The gated charged particle emission device 10 is one type of micro-fabricated structure that can use the liquid wetting processes of the invention, and is being presented herein as an illustrative example. For example, the principles of the invention apply to non-gated charged particle emission devices (whether or not micro-fabricated), and to charged particle emission devices (gated or non-gated) having a single emitter or an array of emitters. Applications that can use the gated charged particle emission device 10 include, but are not limited to, liquid metal electron sources, liquid metal ion sources, semiconductor mask repair systems, focused ion beam equipment, ion thrusters, charge management systems, micro-analytical techniques, and electric propulsion systems.

The gated charged particle emission device 10 is a micro-fabricated device having a plurality of emitters 12 (also called charged particle emission sites) and an integrated gate (or gate electrode) 14. "Integrated" means that the gate electrode 14 is part of the micro-fabricated structure that includes the emitters 12, and "micro-fabricated" means that the devices are made by techniques for fabricating structures having microscopic features. Examples of such techniques include, but are not limited to, semiconductor processing (e.g., for integrated circuits), chemical vapor deposition (e.g., for carbon nanotubes), and liquid chemistry (e.g., for nano-scale colloidal particles).

The emitters 12 are formed in a substrate 16. The substrate 16 can be made of various materials including, but not limited to, silicon, tungsten, silicon dioxide, oxynitride, and sapphire. The substrate 16 can include a dielectric layer (not shown) for electrically isolating the substrate from the emitters and/or the liquid metal. Each emitter 12 has an emission site including an open-ended tip 18 and a liquid-metal-conducting micro-channel 20. The sides 21 of the micro-channels 20 can be constructed of electrically conductive or electrically non-conductive material. Each micro-channel 20 connects the respective open-ended tip 18 to a source of ionizable material (i.e., liquid metal). In this embodiment, the source of ionizable material is a reservoir 22 of liquid metal within the substrate 16 of the device 10. In the embodiment shown, the emitters 12 share the liquid metal reservoir 22. Other embodiments can have separate reservoirs for individual or groups of emitters 12.

Insertion of the liquid metal into the reservoir 22 can occur at the time of fabricating the device 10, and thus the liquid metal is included in the device 10 when the device 10 is shipped or sold. Alternatively, insertion can occur during the use of the device 10 (i.e., post-fabrication). The micro-channels 20 fill with the liquid metal through passive or active means, such as capillary action and pumping, respectively. In accordance with the present invention, an electrically conductive coating or layer 24 lines the interior surfaces of the micro-channels 20 and reservoir 22 and wets the liquid metal so that the liquid metal can flow, through capillary action, sufficiently near the tips 18 of the emitters 12 to become ionized. The conductive layer 24 can also extend along a base 30 of the device 10 to form an exposed outer surface that provides electrical contact to the liquid metal through a socket or plug adapted to receive and form an electrical connection to the device 10 (similar in function and operation to the external base electrode of a watch battery).

In the embodiment shown, the gate electrode 14 comprises a plurality of individually addressable gate electrodes 14-1 and 14-2. Each individually addressable gate electrode 14-1 and 14-2 is located adjacent to the open-ended ion-emitting tip 18 of a corresponding emitter (typically within ten to twenty microns of the tip). The individually addressable gate electrode can be disposed above, below, or on the same plane as the open-ended tip 18 of the corresponding emitter 12. Each individually addressable gate electrode 14-1, 14-2 can activate one emitter or group of emitters (e.g., groups of ten, hundreds, thousands, and hundreds of thousands of emitters). In another embodiment, all emitters 12 in the charged particle emission device 10 share the gate electrode 14 (i.e., not individually addressable).

A spacer or layer 26 is disposed between the gate electrode 14 and the substrate 16. For a non-conducting substrate 16, the gate electrode 14 can be disposed on the substrate 16 (i.e., without an intervening spacer 26). If the substrate 16 is electrically conducting, a non-conducting spacer 26 is used to electrically isolate the gate electrode 14 from the substrate 16. In addition, a voltage can be applied to the conductive substrate 16 to control the electric field at the emitter tip 18 and, by controlling the electric field, to restrict the movement of dispensed ions toward the gate electrode 14.

When there is sufficient voltage (e.g., typically 500 v to 1000 v) between the gate electrode 14 and a given emitter 12, the liquid metal at the tip 18 of that emitter 12 ionizes and the emitter emits the positive ions or negative electrons, depending upon the particular bias of the applied voltage). To enable the application of a voltage between the gate electrode 14 and the liquid metal in the emitters 12, electrical contact can be made with the liquid metal through the conductive layer 24 or through direct contact with the liquid metal by an electrode 32 (e.g., a conductive needle), or both.

Figure 2:
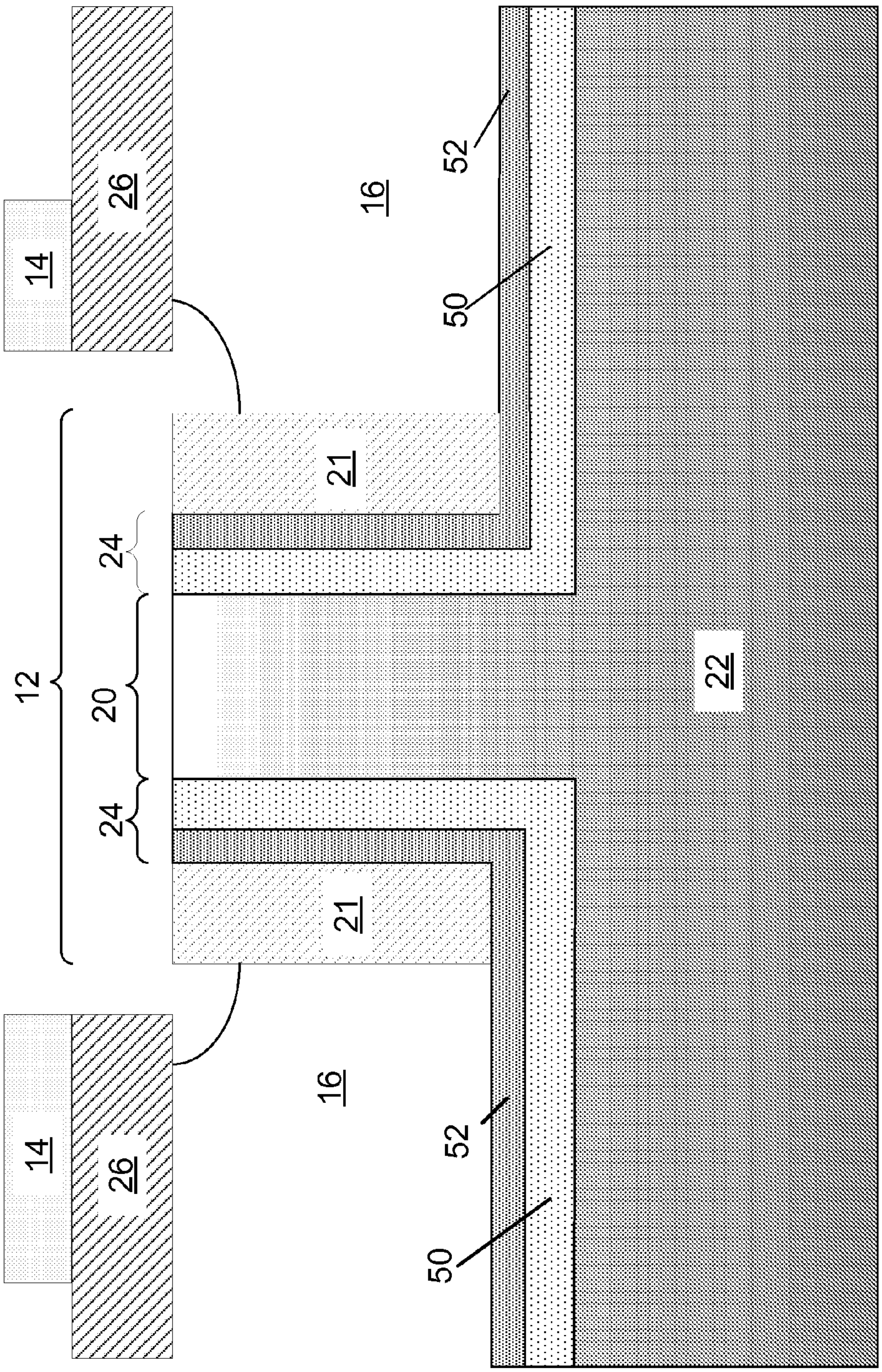
FIG. 2 is a cross-section view of an emitter of the gated charged particle emission device illustrating a multi-layer interior coating of the emitter channel for wetting liquid metal.

FIG. 2 diagrammatically shows one embodiment of the layer 24 of FIG. 1 that lines the interior surfaces of the micro-channels 20 and reservoir 22. In this embodiment, the layer 24 includes a wetting layer 50 and an adhesion layer 52 disposed between the wetting layer 50 and the interior surfaces of the channel 20 and of the reservoir 22. Silicon is the base micro-fabrication material for the interior surfaces of the channel. Although liquid metals can wet silicon, they do not wet silicon well enough to enable the liquid metals to reach the tip 18 of the emitter 12, particularly when microscopic geometries are involved. The wetting layer 50 of the coating 24 facilitates wetting so that the liquid metal flows to the tip 18 of the emitter 12. The coating 24 extends to the rim at the tip 18 of the emitter 12, but not beyond. The transition from wetting layer 50 to non-wetting dielectric at the rim constrains the flow of liquid metal to the micro-channel 20.

In one embodiment, the wetting layer 50 is made of gold, a non-oxidizing noble metal that wets liquid metals such as gallium and indium. Both gallium and indium form liquids at relatively low temperatures: Gallium is liquid at slightly above room temperature, around 29° C. (85° F.) and indium at 157° C. (313° F.). Mildly heating gallium to a temperature of approximately 40° C. can initiate wetting on gold, whereas an approximate temperature of 200° C. can initiate wetting on platinum. For initiating wetting of indium, approximate wetting temperatures are 170° C. for gold and 330° C. for platinum. Increasing the temperature beyond what is sufficient to initiate wetting can accelerate the wetting process. Accordingly, the wetting and filling of the charged particle emission device 10 with liquid metal can occur at relatively low temperatures when compared to conventional approaches that do not use a wetting layer (i.e., typically over 600° C.).

Gold chemically interacts with gallium and indium and each resulting material (i.e., gallium gold or indium gold) has a considerably higher melting point than the unadulterated liquid metal. Consequently, the resulting material could potentially fail to flow to the tips 18 of the emitters 12 if such material, produced where the liquid metal meets the gold, is no longer in a liquid state. One technique for avoiding this potential problem is for the gold layer to be sufficiently thin such that the gold layer is, in effect, a sacrificial layer that wets and interacts with the liquid metal in its entirety, leaving a sufficient amount of liquid metal to flow to the tip 18 of the emitter 12. This result has been achieved with gold layers of thicknesses ranging from 30 to 200 nm for micro-channels 20 with a diameter ranging from approximately 0.2 microns to 100 microns. Although wetting is achievable with thinner layers of non-oxidizing metal, the wetting performance may degrade with time if the non-oxidizing metal dissolves into the adhesion layer (or barrier layer—FIG. 3). For micro-channels below 0.2 microns in diameter, the amount of gold may be proportionally too great for the gold wetting layer 50 to be sacrificial and, thus, may present a problem to the flow of the liquid metal.

With a gold wetting layer 50, the adhesion layer 52 is particularly useful because the gold may not adhere well to the substrate 16 (e.g., silicon). The chemical composition of the adhesion layer 52 is such that it adheres to the substrate 16 and provides a surface to which the gold wetting layer 50 can adhere. In one embodiment, the adhesion layer 52 is made of the titanium-tungsten (TiW). The thickness of a TiW adhesion layer 52 may be approximately 50 nm. Other compositions for use in making the adhesion layer 52 include, but are not limited to, niobium, chromium, titanium, and tungsten. Adhesion layers of chromium can be as thin as 10 nm. When using titanium or chromium adhesion layers, a barrier layer (FIG. 3) is used to prevent the material of the adhesion layer from dissolving into the liquid metal and, thus, performing inadequately as an adhesion layer.

In another embodiment, the wetting layer 50 is made of platinum, another non-oxidizing noble metal that wets liquid metals, such as gallium and indium. Platinum also chemically interacts with gallium and indium and produces a material (i.e., gallium platinum or indium platinum) with a higher melting point than the liquid metal. Accordingly, the layer of platinum is sufficiently thin so as not to consume too high percentage of the liquid metal, changing it into non-liquid form, and thus preventing it from flowing to the tip. As a result, the liquid metal is able to wet liquid metal as far as the tip 18 of the emitter 12. Platinum layers of thicknesses in the range of 30 to 100 nm may achieve wetting of the liquid metal to the emitter tip 18. At such thicknesses, the platinum layer may be a sacrificial layer (i.e., fully interacted with the liquid metal). In addition, the above-described adhesion layer 52 can be used to provide a surface to which the platinum wetting layer 50 can adhere.

Gold and platinum are two examples of non-oxidizing metals that may be used to produce the wetting layer 50. Other non-oxidizing metals may be used as to produce the wetting layer 50 without departing from the principles of the invention (e.g., nickel and copper).

Figure 3:
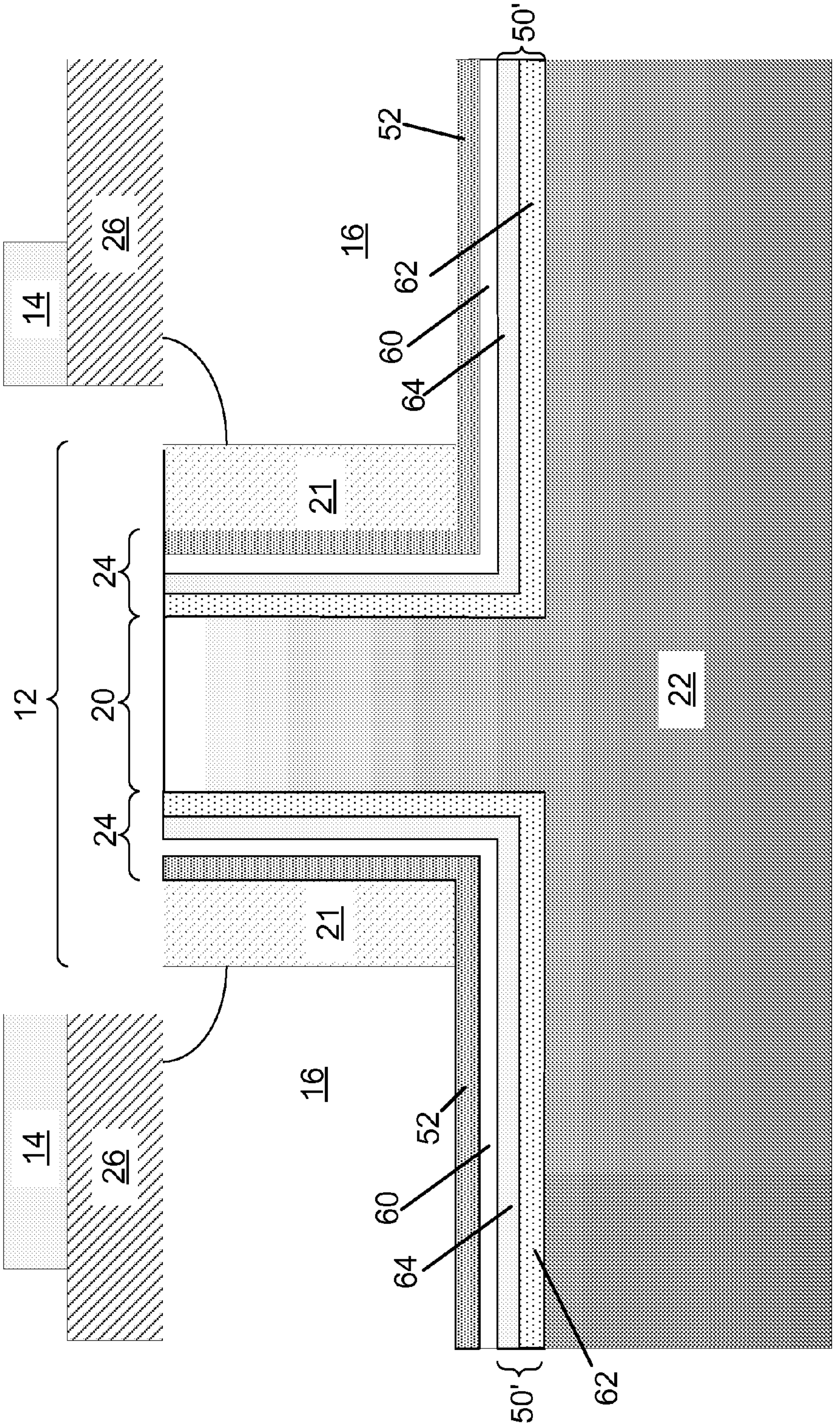
FIG. 3 is a cross-section view of an emitter of the gated charged particle emission device illustrating another embodiment of a multi-layer interior coating of the emitter channel for wetting liquid metal.

FIG. 3 diagrammatically shows another embodiment of the layer 24 of FIG. 1 that lines the interior surfaces of the micro-channels 20 and reservoir 22. In this embodiment, the layer 24 includes a barrier layer 60 disposed between the adhesion layer 52 and a wetting layer 50'. Materials for constructing the barrier layer 60 include tungsten and TiW. Other materials for constructing the barrier layer 60 may include tantalum, tantalum nitride, and tungsten nitride. The barrier layer 60 protects the substrate 16 from the liquid metal and prevents the non-oxidizing metal from migrating into the adhesion layer 52, thus exposing the wetting layer 50' to oxidation. In some embodiments, the barrier layer 60 and adhesion layer 52 can be the same layer. In addition, if the material composition of the substrate 16 does not interact with the liquid metal, the barrier layer 60 may be unnecessary.

In the embodiment shown, the wetting layer 50' is comprised of multiple layers, including an outer non-oxidizing coating 62 and an inner wetting metal layer 64 disposed between the non-oxidizing coating 62 and the barrier layer 60. The wetting metal layer 64 is made of material (e.g., tungsten and titanium tungsten) suited to wetting liquid metal. Other materials for constructing the wetting metal layer 64 may include tantalum, tantalum nitride, and tungsten nitride. This wetting metal layer 64 may be electrically conductive or non-conductive, depending on whether the liquid metal is conductive (e.g., the metal layer 64 does not need to be conductive if the liquid metal is conductive). The non-oxidizing coating 62, for example, gold or platinum, protects the wetting metal layer 64 from oxidation and can operate as a sacrificial layer, as described above.

FIG. 4 shows a cross-section of an embodiment of an emitter 12 for illustrating a scale of geometries for which liquid metal wetting of the present invention has been attained. Here, the emitter 12 is cylindrical in shape. In one embodiment in which liquid metal has reached the tip 18 of the emitter 12 by capillary action, the micro-channel 20 has a length 80 of approximately 60 microns and diameter 84 of approximately 20 microns. In other embodiments, the micro-channel 20 of a 7-micron nozzle emitter has a length 80 of one to four microns and diameter 84 ranging from approximately 0.2 microns to 1.0 micron. Cylindrical is just one exemplary shape for emitters. The liquid wetting techniques can be practiced with emitter of other shapes, for example, “volcano” or cone-shaped, pointed-tip needles, and posts.

FIG. 5 shows a top view of an array 90 of cylindrical emitters 12 (non-gated) to illustrate a scale of geometries for the charged particle emission device 10 in which the liquid metal wetting technique of the present invention is embodied. In one embodiment, the distance 94 between centers of adjacent emitters 12, in a column or in a row, ranges from approximately 10 to 30 microns. Although only nine emitters 12 are shown, it is to be understood that the charged particle emission device 10 can be fabricated with hundreds of thousands or millions of such emitters 12. The liquid metal wetting technique of the invention is particularly advantageous over conventional techniques when used with arrays of densely packed emitters. The relatively low temperatures at which wetting can occur avoids problems of evaporation and unwanted coating experienced by those conventional techniques that employ high temperature to enhance wetting.

Figure 6:
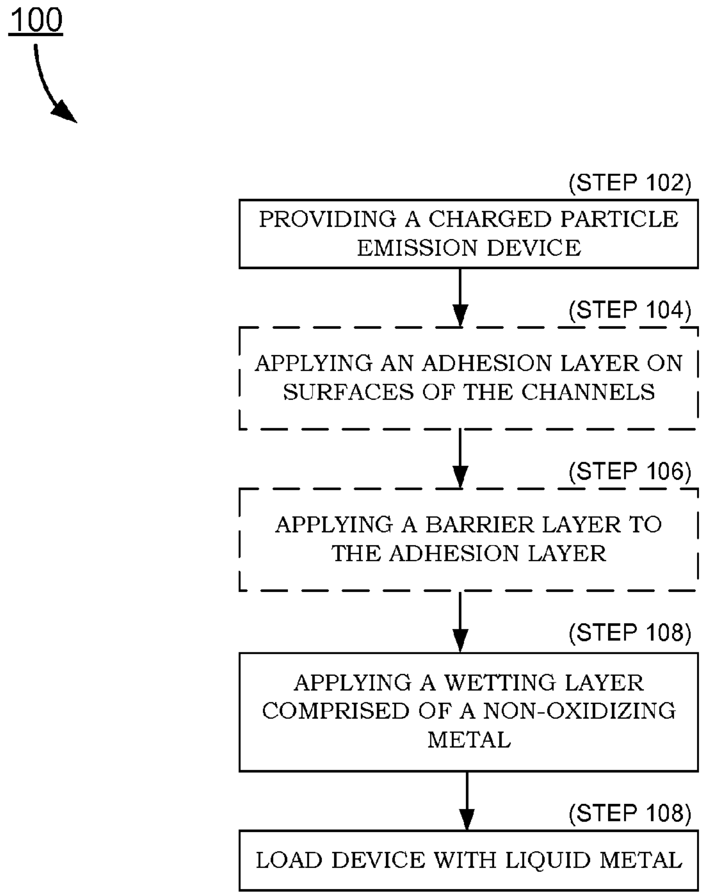
FIG. 6 is a flow diagram of an embodiment of a process for filling the micro-channels of a charged particle emission device with liquid metal in accordance with the invention.

FIG. 6 shows an embodiment of a process 100 for constructing and filling the emitters 12 of the charged particle emission device 10 with liquid metal in accordance with the invention. In a description of the process 100, reference is also made to FIG. 1 and FIG. 2.

At step 102, the gated charged particle emission device 10 is micro-fabricated having emitters 12 with micro-channels channels 20 and one or more reservoirs 22 for receiving liquid metal (e.g., gallium, indium) to serve as a charged particle source. When the non-oxidizing metal that is to be applied to the interior surfaces of the micro-channels 20 and reservoir 22 as a wetting layer 50 does not adhere well to the substrate 16, an adhesion layer 104 is first laid down (step 104) over such interior surfaces. Some wetting layers 50 may adhere sufficiently well to the substrate 16 and, therefore, the adhesion layer 52 is optional.

If the material of the substrate 16 may interact with the liquid metal, a barrier layer 60 can be deposited (step 106) onto the adhesion layer 52, or lacking the adhesion layer 52, directly on the interior surfaces of the micro-channel 20 and reservoir 22. At step 108, the wetting layer 50 is deposited onto the barrier layer 60, onto the adhesion layer 52, or directly onto the interior surfaces of the micro-channel 20 and reservoir 22, depending which layers, if any, have been previously deposited. In one embodiment, deposition of the wetting layer 50 includes depositing a layer 64 of wettable metal followed by a non-oxidizing coating 62 (e.g., gold). The non-oxidizing coating 62 of the wetting layer 50 is sufficiently thin to serve as a sacrificial layer to be consumed almost in its entirety by chemical interactions with the liquid metal, leaving sufficient liquid metal to flow to the rim of the tip of each emitter 20 and serve as a charged particle source.

The various materials for constructing the adhesion, barrier, and layers of the wetting layer can be deposited using conventional sputtering techniques. Other micro-fabrication methods capable of depositing metal on a surface may be employed for constructing structures of the present invention including, but not limited to, vapor deposition, evaporation, electroplating, and atomic layer deposition.

At step 110, the particular metal (e.g., indium, gallium) is poured into or melted within the reservoir 22 of the charged particle emission device 10. Because of the coated interior surfaces of the micro-channels 20 and reservoirs 22, the liquid metal flows sufficiently to the tips of the emitters, where the liquid metal can serve as a charged particle source.

Figure 7A:
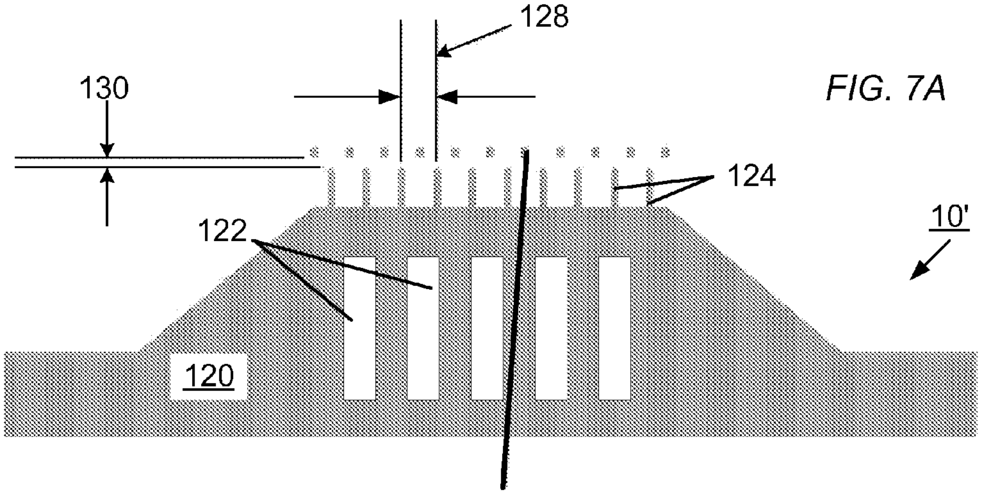
FIG. 7A is a diagram of an embodiment of a charged particle emission device, in particular, a tungsten needle linear array having needles coated with a wetting layer in accordance with the present invention.

FIG. 7A shows another embodiment of a charged particle emission structure 10' constructed in accordance with the invention. In this embodiment, the charged particle emission structure 10' is a tungsten linear needle array. The tungsten linear needle array has a substrate body 120, a plurality of channels 122 for receiving liquid metal, a plurality of needles 124 (i.e., charged particle emission sites) at the edge of the substrate body 120, and a plurality of extractor lines 126 disposed near the needles 124. An exemplary center-to-center distance 128 between needles 124 is approximately 250 microns and an exemplary gap 130 between the extractor lines 126 and the tips of the needles 124 is approximately 50 microns.

Figure 7B:
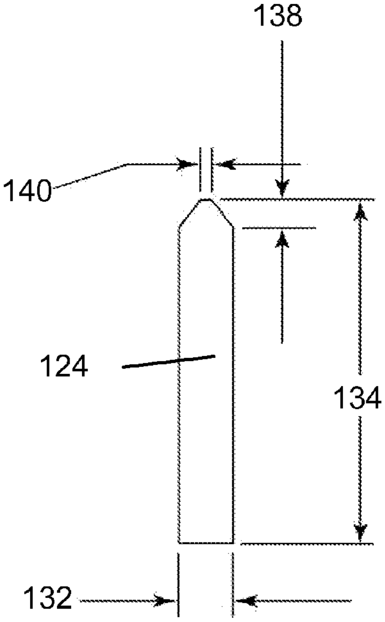
FIG. 7B is a diagram of a needle of the tungsten needle linear array of FIG. 7A.
Figure 7C:
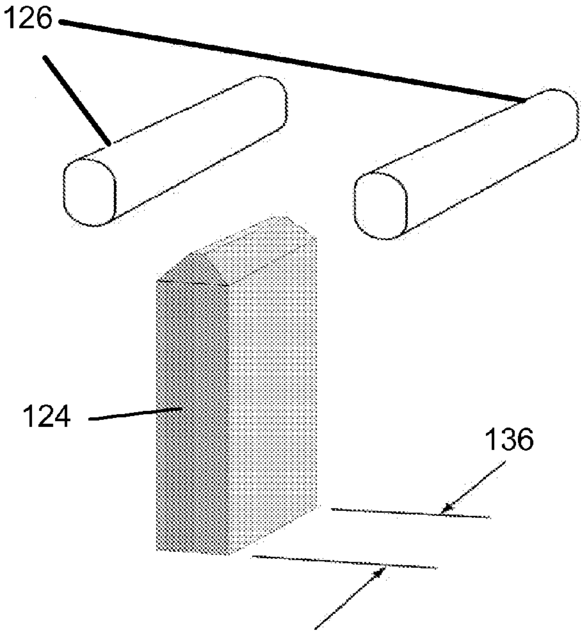
FIG. 7C is an isometric view of the needle of FIG. 7B.

FIG. 7B and FIG. 7C show a representative needle 124 of the tungsten needle linear array 10' of FIG. 7A. The needle 124 has a base width 132 of approximately 50 microns, a length 134 of approximately 300 microns, and a depth 136 of approximately 100 microns. The tip 138 of the needle 124 is approximately 23 microns in length, the point 140 of the tip 138 having a width of approximately 4 microns.

Figure 8A:
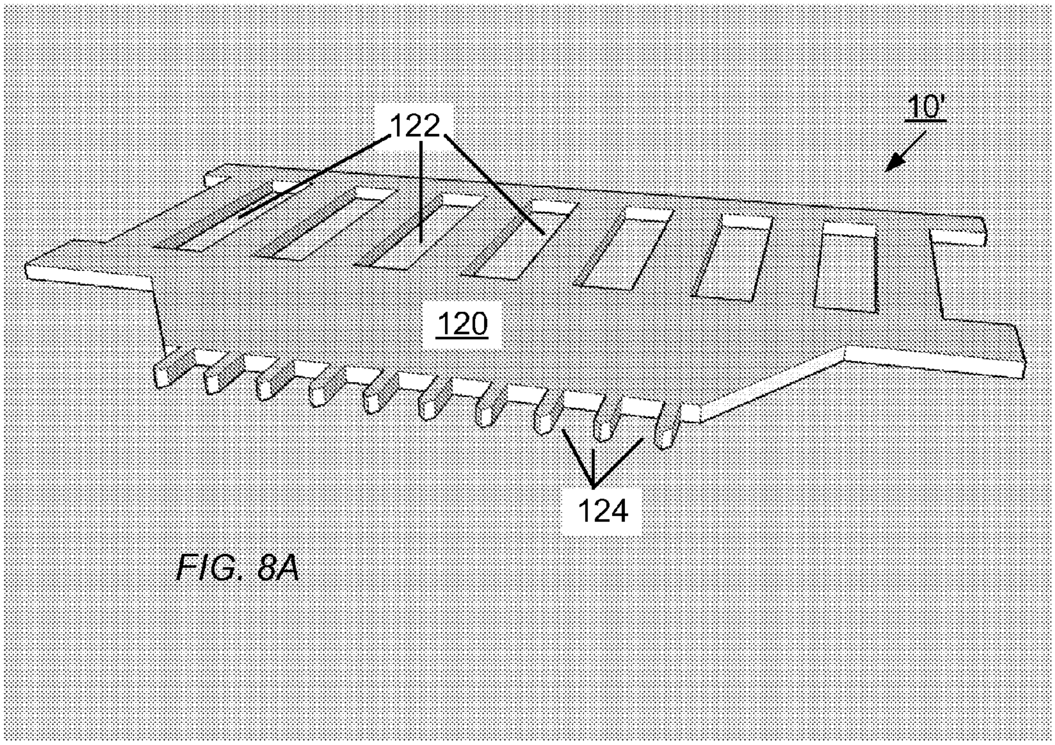
FIG. 8A is a diagram of an embodiment of a tungsten needle linear array without a wetting layer prior to liquid metal wetting.
Figure 8B:
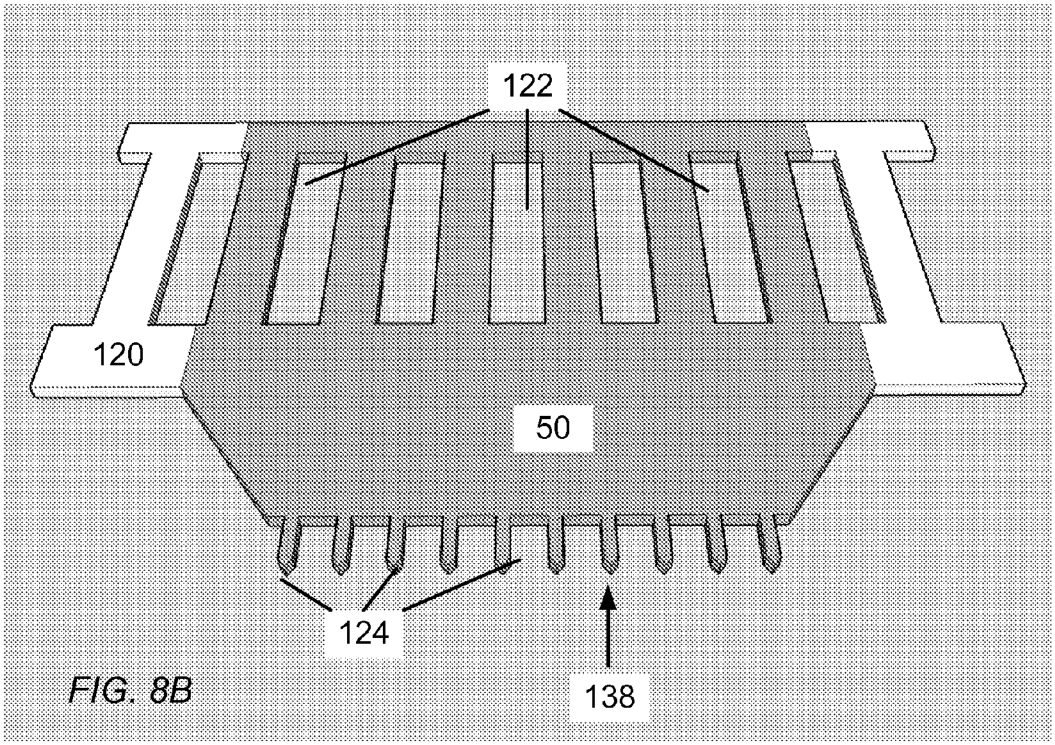
FIG. 8B is a diagram of the tungsten needle linear array after the liquid metal wets to the tips of the needles.

FIG. 8A shows an embodiment of a tungsten linear needle array 10' before application of a wetting layer (50 of FIG. 2 or 50' of FIG. 3). Shown are the substrate body 120, the channels 122 formed in the body 120, and a plurality of needles 124 extending from an edge of the substrate body 120. FIG. 8B shows the tungsten needle linear array 10' after the liquid metal (not shown) fills the channels 122 and wets to the tips 138 of the needles 124. An electric field produced by a voltage applied to the extractor lines 126 with respect to the liquid metal 142 causes the liquid metal at the needle tips 138 to ionize and the needles 124 to emit charged particles.

FIG. 8B also illustrates that the wetting layer 50, in general, can be used to control the direction in which liquid metal flows on or through a substrate. That is, the pattern or tracks of the non-oxidizing metal coating on the substrate define the paths taken by the liquid metal. Conversely, the liquid metal does not flow where no wetting layer 50 is present. Accordingly, a purposeful pattern of a wetting layer deposited on a substrate can be used to control where liquid metal flows and does not flow, ensuring that liquid metal reaches the emission sites without wetting those areas of the structure where liquid metal is unwanted (e.g., on the dielectric).

Figure 9A:
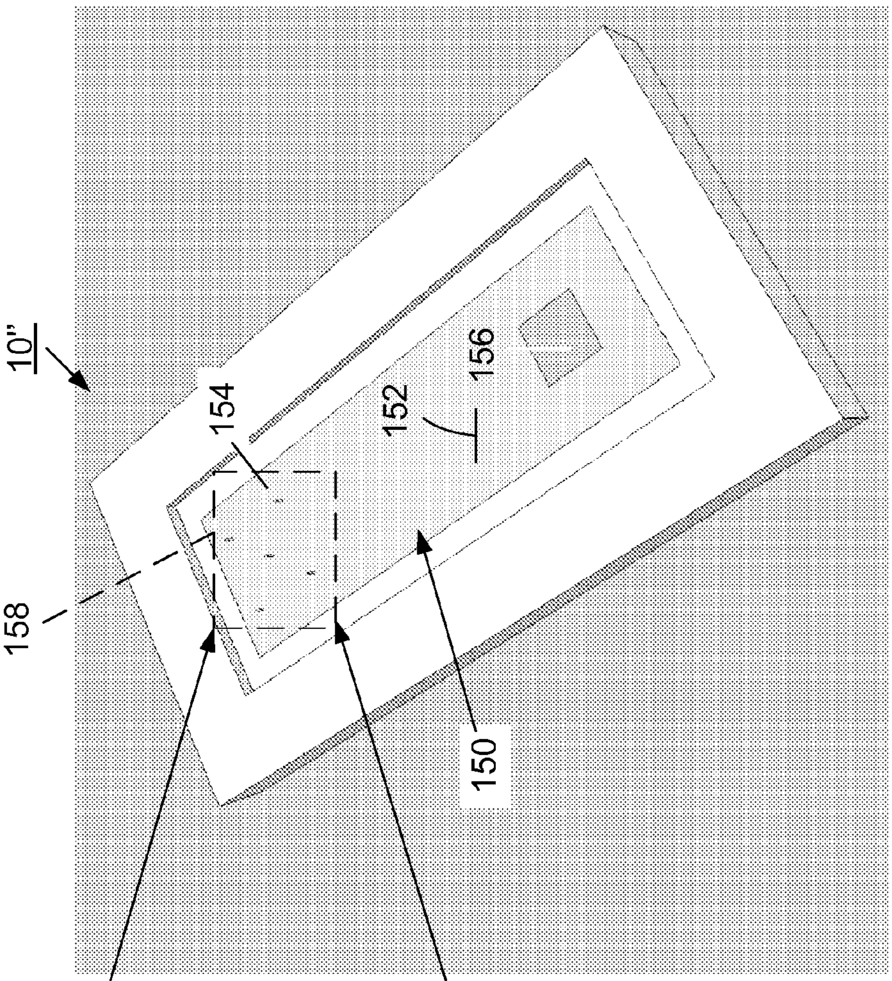
FIG. 9A is a diagram of another embodiment of a charged particle emission device, in particular, a silicon needle array with an open surface channel coated with a wetting layer in accordance with the invention.

FIG. 9A shows another embodiment of a charged particle emission structure 10" constructed in accordance with the invention. In this embodiment, the charged particle emission structure 10" is a silicon needle array with an open surface channel 150. Projecting from a surface 152 of the structure 10" is an array of needles 154 (within the insert box 158). The surface 152 is coated with a wetting layer (50, 50') of the present invention. An adhesion layer 52 and/or barrier layer 60 may also coat the surface 152, if appropriate. The surface 152 of silicon needle array 10" includes an opening 156 through which liquid metal (e.g., gallium) is delivered, from below, onto the surface 152. In this embodiment, the opening 156 is at an opposite end of the device 10" from the needle array 154. The liquid metal wets the wetting layer within the channel 150 and flows towards the needle array 154.

Figure 9B:
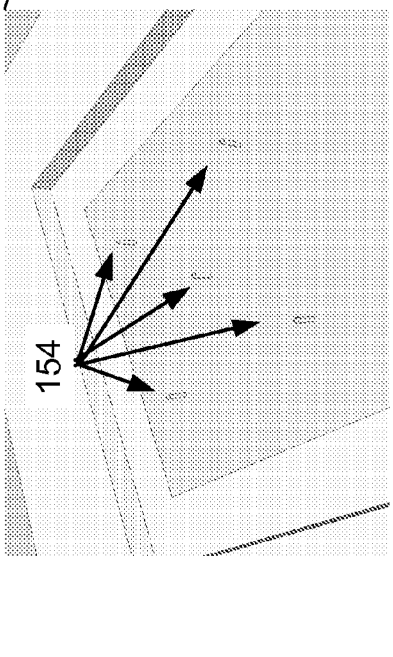
FIG. 9B is an insert of FIG. 9A showing exemplary needles of the needle array.
Figure 9C:
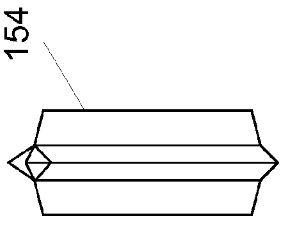
FIG. 9C is a view of an embodiment of one of the needles of the needle array.

FIG. 9B shows the insert 156 of FIG. 9A to provide a detailed image of the array of needles 154 and FIG. 9C shows a diagram of an exemplary representation of one of the needles 154. The needle 154 has a four-pointed star shape that facilitates wicking of the liquid metal from the surface 152 to the needle tip. The length of the needle is approximately 20 microns. Under the influence of an electric field, the liquid metal ionizes at the needle tip, from which charged particles are then emitted.

Figure 10:
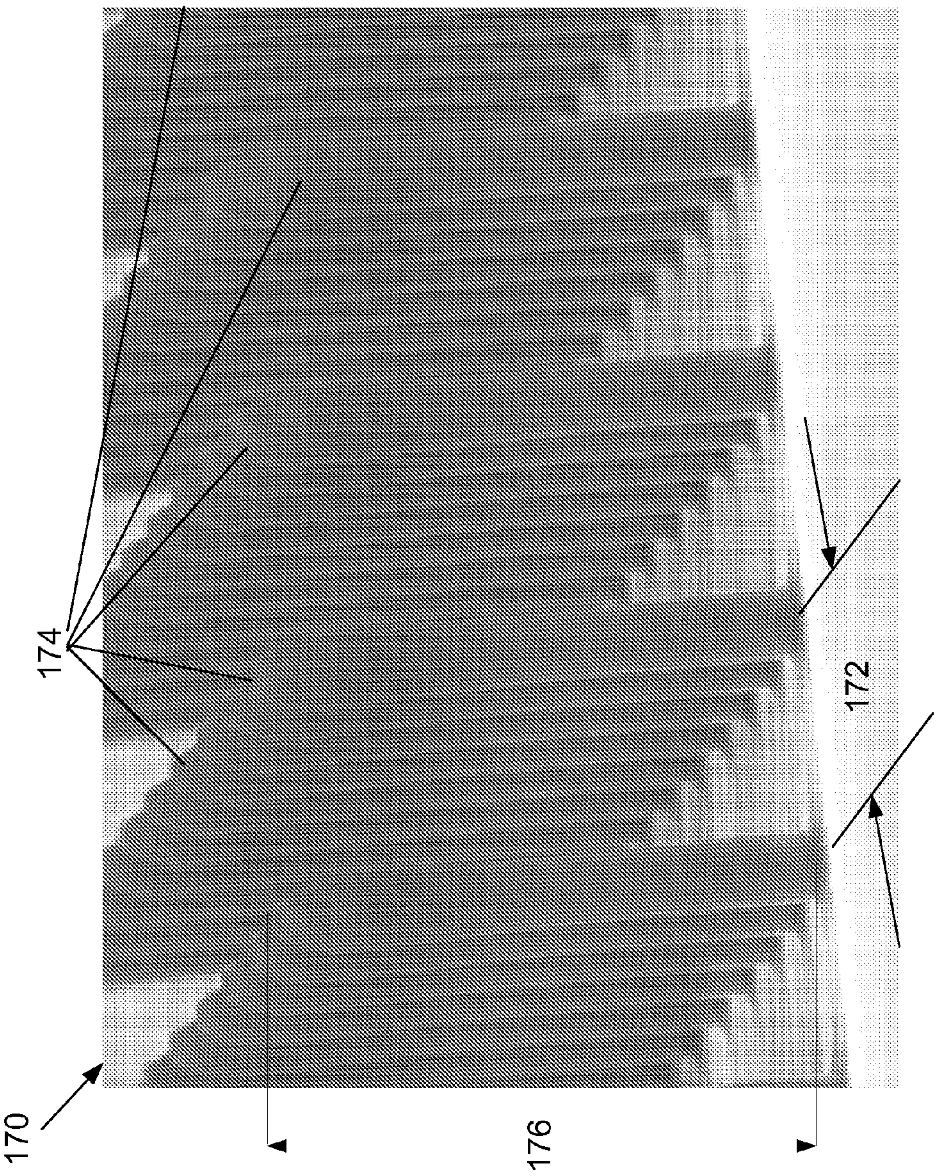
FIG. 10 is an image of another embodiment of a needle array that can be embodied in a silicon needle array like the silicon needle array of FIG. 9A.

FIG. 10 shows another embodiment of a needle array 170 that can be embodied in the charged particle emission structure 10" of FIG. 9A. In a description of this embodiment, reference is also made to features of the charged particle emission device 10" of FIG. 9A. In this embodiment, the spacing 172 between adjacent needles 174 is approximately 2 to 5 microns, and the length 176 of each needle is approximately 20 microns. Similar to the embodiment shown in FIG. 9A, the wetting layer on the surface 152 enables the liquid metal to flow from the opening 156 to the base of the needles 174. From the base of each needle 174, the liquid metal wicks to the needle tip.

While the invention has been shown and described with reference to specific preferred embodiments, it should be understood by those skilled in the art that various changes in form and detail may be made therein without departing from the spirit and scope of the invention as defined by the following claims.

What is claimed is:

1. A micro-fabricated charged particle emission device comprising:
- a substrate;
- a plurality of charged particle emission sites formed in the substrate; and
- a path between each charged particle emission site and a source of liquid metal, each path having a surface coated with a wetting layer of a non-oxidizing metal, the wetting layer being sufficiently thin such that some liquid metal is able to flow from the liquid metal source to each emission site despite any chemical interaction between the liquid metal and the non-oxidizing metal of the wetting layer.

2. The micro-fabricated charged particle emission device of claim 1, wherein the non-oxidizing metal is gold.

3. The micro-fabricated charged particle emission device of claim 2, wherein the layer of gold is approximately 30 nm to 200 nm in thickness.

4. The micro-fabricated charged particle emission device of claim 1, wherein the non-oxidizing metal is platinum.

5. The micro-fabricated charged particle emission device of claim 1, wherein the liquid metal is gallium.

6. The micro-fabricated charged particle emission device of claim 5, wherein the non-oxidizing metal of the wetting layer is gold, and gallium wets the wetting layer at a temperature of approximately 40 degrees Celsius.

7. The micro-fabricated charged particle emission device of claim 1, wherein the liquid metal is indium.

8. The micro-fabricated charged particle emission device of claim 1, wherein each path has a width of approximately 20 microns and a length of approximately 60 microns.

9. The micro-fabricated charged particle emission device of claim 1, wherein each path has a width of 0.2 microns to 1.0 micron and a length of one to four microns.

10. The micro-fabricated charged particle emission device of claim 1, further comprising an adhesion layer disposed between the wetting layer and the surface of each path.

11. The micro-fabricated charged particle emission device of claim 10, wherein the adhesion layer is made of one of niobium, titanium, a titanium-tungsten alloy, or chromium.

12. The micro-fabricated charged particle emission device of claim 10, wherein the adhesion layer is approximately 10 nm in thickness.

13. The micro-fabricated charged particle emission device of claim 1, further comprising a barrier layer disposed between the wetting layer and the substrate.

14. The micro-fabricated charged particle emission device of claim 1, wherein the wetting layer includes a layer of wettable metal coated with the non-oxidizing metal.

15. A method of constructing a charged particle emission device, the method comprising:
- fabricating a plurality of charged particle emission sites in a substrate with a path between each charged particle emission site and a source of liquid metal; and
- applying a wetting layer of non-oxidizing metal to a surface of each path for wetting the liquid metal, the wetting layer being sufficiently thin such that some liquid metal is able to flow from the source of liquid metal to each emission site despite any chemical interaction between the non-oxidizing metal of the wetting layer and the liquid metal.

16. The method of claim 15, wherein the non-oxidizing metal is gold.

17. The method of claim 16, wherein the layer of gold is approximately 30 nm to 200 nm in thickness.

18. The method of claim 15, wherein the non-oxidizing metal is platinum.

19. The method of claim 15, wherein the liquid metal is gallium.

20. The method of claim 19, wherein the non-oxidizing metal of the wetting layer is gold and gallium wets the wetting layer at a temperature of approximately 40 degrees Celsius.

21. The method of claim 15, wherein the liquid metal is indium.

22. The method of claim 15, wherein each path has a width of approximately 20 microns and a length of approximately 60 microns.

23. The method of claim 15, wherein each path has a width of 0.2 microns to 1.0 micron and a length of one to four microns.

24. The method of claim 15, further comprising coating the surface of each path with an adhesion layer before applying the wetting layer to the surface of that path.

25. The method of claim 24, wherein the adhesion layer is made of one of niobium, titanium, a titanium-tungsten alloy, or chromium.

26. The method of claim 24, wherein the adhesion layer is approximately 10 nm in thickness.

27. The method of claim 15, further comprising depositing a barrier layer between the wetting layer and the substrate.

28. The method of claim 15, wherein the wetting layer includes a layer of wettable metal coated with the non-oxidizing metal.

29. A system, comprising:
- a micro-fabricated charged particle emission device comprising:
  - a substrate;
  - a plurality of charged particle emission sites formed in the substrate; and
  - a path extending between each emission site and a source of liquid metal, each path being coated with a wetting layer of non-oxidizing metal for wetting the liquid metal, the wetting layer being sufficiently thin such that some liquid metal is able to flow to each emission site despite any chemical interaction between the liquid metal and the non-oxidizing metal of the wetting layer.

30. The system of claim 29, wherein the non-oxidizing metal is gold.

31. The system of claim 30, wherein the layer of gold is approximately 30 nm to 200 nm in thickness.

32. The system of claim 29, wherein the non-oxidizing metal is platinum.

33. The system of claim 29, wherein the liquid metal is gallium.

34. The system of claim 33, wherein the non-oxidizing metal of the wetting layer is gold and the gallium wets the wetting layer at a temperature of approximately 40 degrees Celsius.

35. The system of claim 29, wherein the liquid metal is indium.

36. The system of claim 29, wherein each path has a width of approximately 20 microns and a length of approximately 60 microns.

37. The system of claim 29, wherein each path has a width of 0.2 microns to 1.0 micron and a length of one to four microns.

38. The system of claim 29, further comprising an adhesion layer disposed between the wetting layer and the surface of each path.

39. The system of claim 38, wherein the adhesion layer is made of one of niobium, titanium, a titanium-tungsten alloy, or chromium.

40. The system of claim 24, wherein the adhesion layer is approximately 10 nm in thickness.

41. The system of claim 29, further comprising a barrier layer disposed between the wetting layer and the substrate.

42. The system of claim 29, wherein the wetting layer includes a layer of wettable metal coated with the non-oxidizing metal.

* * * * *

UNITED STATES PATENT AND TRADEMARK OFFICE

CERTIFICATE OF CORRECTION

PATENT NO. : 8,138,665 B2
APPLICATION NO. : 12/306264
DATED : March 20, 2012
INVENTOR(S) : Holland et al.

It is certified that error appears in the above-identified patent and that said Letters Patent is hereby corrected as shown below:

Column 12, lines 13-14, in claim 40: replace “The system of claim 24, wherein the adhesion layer is approximately 10 nm in thickness.” with --The system of claim 38, wherein the adhesion layer is approximately 10 nm in thickness.--.

Signed and Sealed this
Ninth Day of April, 2013

Teresa Stanek Rea
*Acting Director of the United States Patent and Trademark Office*